United States Patent
Zhang

(10) Patent No.: US 7,555,051 B2
(45) Date of Patent: Jun. 30, 2009

(54) METHOD AND DEVICE FOR ESTIMATING IQ IMBALANCE

(75) Inventor: Yifeng Zhang, San Jose, CA (US)

(73) Assignee: NXP B.V., Eindhoven (NL)

( * ) Notice: Subject to any disclaimer, the term of this patent is extended or adjusted under 35 U.S.C. 154(b) by 610 days.

(21) Appl. No.: 10/557,660

(22) PCT Filed: May 28, 2004

(86) PCT No.: PCT/IB2004/001753

§ 371 (c)(1),
(2), (4) Date: Nov. 21, 2005

(87) PCT Pub. No.: WO2004/107697

PCT Pub. Date: Dec. 9, 2004

(65) Prior Publication Data

US 2007/0058702 A1    Mar. 15, 2007

Related U.S. Application Data

(60) Provisional application No. 60/474,495, filed on May 30, 2003.

(51) Int. Cl.
*H04L 5/12* (2006.01)
(52) U.S. Cl. ........................ 375/261; 327/238; 327/254; 331/103; 332/103; 342/174; 342/194; 375/219; 375/235; 375/298; 375/328

(58) Field of Classification Search ............... 375/219, 375/261, 297, 308, 321, 324; 329/308; 342/174; 708/422; 332/103; 455/313
See application file for complete search history.

(56) References Cited

U.S. PATENT DOCUMENTS

| 6,298,035 | B1 | 10/2001 | Heiskala |
| 2002/0051497 | A1* | 5/2002 | Breems et al. ............... 375/261 |
| 2003/0035470 | A1* | 2/2003 | Gu ............................... 375/219 |

* cited by examiner

*Primary Examiner*—David C Payne
*Assistant Examiner*—Adolf Dsouza

(57) ABSTRACT

A quadrature transmitter and receiver have configurable I and Q channel paths that facilitate the application of selected test signals to determine gain and phase imbalances introduced by the transmitter and receiver. In a first 'normal' configuration, the I and Q channels are independently tested by applying an I-only test signal, followed by a Q-only test signal. In a second 'switched transmitter' configuration, the Q-only test signal is again applied. In a third 'switched receiver' configuration, the I-only test signal is again applied. By combining the results, gain and phase imbalances of the transmitter and the receiver can be determined. In a preferred embodiment, these configurations and test signals are applied within a single transceiver that has the output of its transmitter closed-loop coupled to the input of its receiver.

17 Claims, 1 Drawing Sheet

METHOD AND DEVICE FOR ESTIMATING IQ IMBALANCE

CROSS REFERENCE TO RELATED APPLICATION

Figure 1:
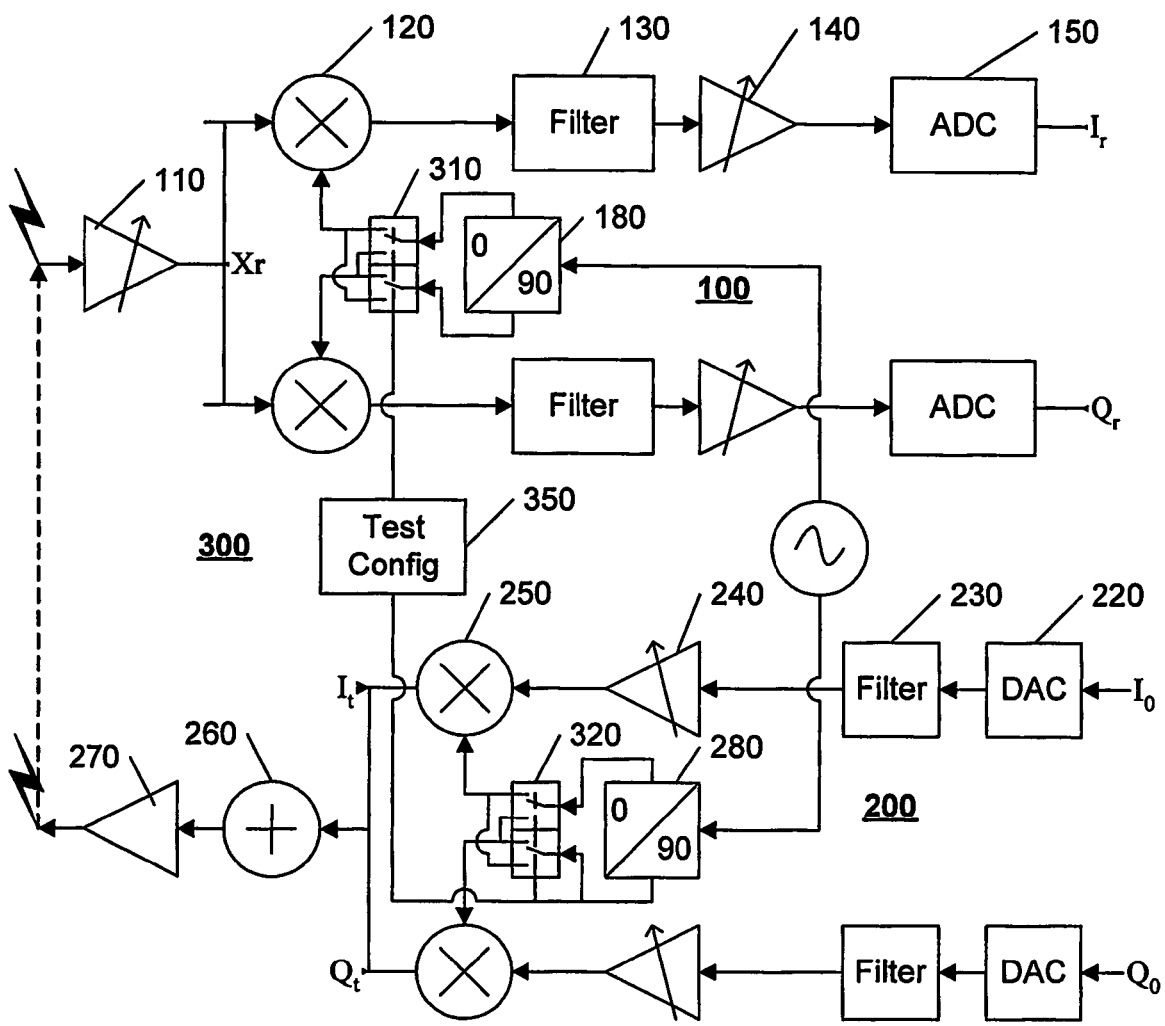

This application claims the benefit of U.S. provisional application Ser. No. 60/474,495 filed 30 May 2003, which is incorporated herein whole by reference.

This invention relates to the field of communications, and in particular to a system and method for detecting I/Q imbalance in a quadrature communications system.

The use of quadrature modulation and demodulation is a common communication technique for communicating digital data as a stream of two-bit symbols. A first stream corresponding to one of the bits of the symbol is modulated by an "in-phase" (I) oscillation signal, and a second stream corresponding to the other bit of the symbol is modulated by a "quadrature-phase" (Q) oscillation signal that is ninety degrees out of phase from the in-phase (I) oscillation signal. The I and Q modulated signals are combined to form a composite signal for transmission. The orthogonal nature of the modulation allows for a reliable demodulation of individual I and Q modulated bit streams at a receiving system.

IEEE 802.11a/g specifies an Orthogonal Frequency Division Multiplex (OFDM) scheme that employs a combination of frequency division multiplexing and quadrature modulation and demodulation to effect high-speed wireless data transfer. At the OFDM transmitter, the outputs of a plurality of quadrature modulation systems are frequency-division-multiplexed for transmission to a corresponding OFDM receiver.

As in all quadrature modulation and demodulation systems, OFDM systems are sensitive to phase shifts that cause the I and Q modulated signals to become non-orthogonal, commonly termed "I/Q channel mismatch". U.S. Pat. No. 6,298,035 "ESTIMATION OF TWO PROPAGATION CHANNELS IN OFDM", issued 2 Oct. 2001 to Juha Heiskala, incorporated by reference herein, provides an overview of the principles of OFDM modulation and demodulation, and discloses a method of estimating the frequency response of each transmission channel by transmitting select training symbols between two transceivers. This method particularly addresses the frequency-dependent effects caused by multipath fading and interference, and provides an adaptive solution based on actual transmissions from one transceiver to another.

As noted above, the known quadrature relationship between the I and Q signals in a quadrature system allows for a highly reliable (i.e. noise-insensitive) demodulation of the I and Q modulated bit streams at the receiving system. Component variations that introduce unequal processing of the signals within each channel adversely affect the reliability or noise-insensitivity of a quadrature system. If the transmitter provides an unequal gain or phase shift to each channel, the transmitted signals will not be truly quadrature; if the receiver provides an unequal gain or phase shift to each channel, the demodulation will not be truly quadrature.

It is an object of this invention to provide a system and method for determining the amount of gain and phase imbalance within each of a quadrature transmitter and quadrature receiver. It is a further object of this invention to provide a system and method for determining the amount of gain and phase transmitter and receiver imbalance within a single transceiver.

These objects and others are achieved by providing a quadrature transmitter and receiver that have configurable I and Q channel paths that facilitate the application of select test signals to determine the gain and phase imbalance introduced by each of the transmitter and receiver. In a first 'normal' configuration, each of the I and Q channels are independently tested by applying an I-only test signal, followed by a Q-only test signal. In a second 'switched transmitter' configuration, the Q-only test signal is again applied. In a third 'switched receiver' configuration, the I-only test signal is again applied. By combining the results of the application of each of these test signals, the gain and phase imbalance of each of the transmitter and the receiver can be determined. In a preferred embodiment, these configurations and test signals are applied within a single transceiver that has the output of its transmitter closed-loop coupled to the input of its receiver.

FIG. 1 illustrates an example block diagram of a quadrature transmitter and receiver in accordance with this invention.

FIG. 1 illustrates an example block diagram of a quadrature transmitter 200 and receiver 100 in accordance with this invention. In a preferred embodiment, the transmitter 200 and receiver 100 are included within a single transceiver 300, although one of ordinary skill in the art will recognize that the principles of this invention are applicable to individual embodiments of transmitters and receivers.

The receiver 100 includes a tunable front end 110 whose output is demodulated by a quadrature demodulator to provide quadrature output signals Ir and Qr. For ease of illustration, only one branch of the quadrature demodulator is described herein, the other branch being functionally equivalent, but operating at an orthogonal phase provided by the quadrature phase generator 180. The output of the front end 110 is demodulated by a mixer 120, and filtered by a filter 130. A tunable amplifier 140 provides a baseband analog signal, which is converted into digital samples via the analog-to-digital converter (ADC) 150 to form the demodulated quadrature output signal Ir/Qr.

The transmitter 200 receives two digital streams $I_0$ and $Q_0$ for quadrature channel modulation and transmission. As with the receiver 100, for ease of illustration, only one branch of the quadrature modulator is described herein, the other branch being functionally equivalent. A digital-to-analog (DAC) converter 220 converts the samples of the digital input stream into an analog signal that is filtered by the filter 230 and provided to a tunable amplifier 240. The mixer 250 provides the quadrature modulation, the streams being mixed via modulation signals that are separated in phase by ninety degrees from the quadrature generator 280, to form transmission signals $I_t$ and $Q_t$. The adder 260 combines the quadrature-modulated signals $I_t$ and $Q_t$, and an amplifier 270 prepares the composite signal for transmission.

Illustrated in FIG. 1 are two cross-switches 310, 320, and a test configuration controller 350 that controls these switches 310, 320. In the illustrated 'normal', or default, configuration, the "0" degree phase outputs from the quadrature generators 180 and 280 are coupled to the "I" channel, and the "90" degree phase output from the generators 180 and 280 are coupled to the "Q" channel.

Ideally, the components of transmitter 200 provide identical gain and phase shift to each of the inputs I and Q to produce the outputs It and Qt, except that the output Qt is purposely shifted by 90 degrees by the mixer 250. In the ideal case, the transmitted signal is given as:

$$X_T(t) = I_0(t)^* \cos(\omega t) + Q_0(t)^* \sin(\omega t), \quad (1)$$

where $I_0(t)$ and $Q_0(t)$ are the inputs I and Q to the transmitter. In reality, however, the components may introduce a gain imbalance, hereinafter $g_t$, and an unintended phase imbalance of $\theta_t$. In this case, the output of the transmitter 200 can be expressed as:

$$X_T(t) = I_t(t)^* \cos(\omega t) + Q_t(t)^* \sin(\omega t), \text{ where} \quad (2)$$

$$I_t(t) = I_0(t) - g_t^* \sin \theta_t^* Q_0(t), \text{ and} \quad (2a)$$

$$Q_t(t) = g_t^* \cos \theta_t^* Q_0(t). \quad (2b)$$

In the equations above, $g_t$ is the relative transmitter gain between the I and Q transmit channels (balance being defined as $g_t=1.0$), and $\theta_t$ is the relative transmitter phase shift between the I and Q transmit channels (balance being defined as $\theta_t=0.0$).

In like manner, the components of receiver 100 ideally provide identical gain and phase shift to the received I and Q channels. If an ideal quadrature encoded signal is received, such that:

$$X_R(t)=I_R(t)*\cos(\omega t)+Q_R(t)*\sin(\omega t), \quad (3)$$

then outputs of the receiver will be:

$$I_r(t)=I_R(t), \text{ and} \quad (3a)$$

$$Q_r(t)=Q_R(t). \quad (3b)$$

However, the components of the receiver 100 introduce gain and phase shift imbalance, and thus the output of the receiver 100 given an input $X_R(t)$ can be expressed as:

$$I_r(t)=I_R(t), \text{ and} \quad (4a)$$

$$Q_r(t)=g_r*\sin\theta_r*I_R(t)+g_r*\cos\theta_r*Q_R(t), \quad (4b)$$

where $g_r$ is the relative receiver gain between the I and Q receive channels (balance being defined as $g_r=1.0$), and $\theta_r$ is the relative transmitter phase shift between the I and Q receiver channels (balance being defined as $\theta_r=0.0$).

As can be seen, the actual transmitted signals (equation 2, with 2a, 2b) differs from a true quadrature signal (equation 1), and the actual receiver demodulated output signals (equation 4a, 4b) differ from the true quadrature demodulated output signals (equations 3a, 3b). Combining equations 2a, 2b with 4a, 4b to illustrate the effects of imbalance of the combined effects of transmitter and receiver imbalance, the output of the receiver can be expressed as (hereinafter without explicit regard to time, t, for convenience and ease of understanding):

$$I_r=I_0-g_t*\sin\theta_t*Q_0, \text{ and} \quad (5a)$$

$$Q_r=g_r*\sin\theta_r*I_0+g_r*g_t*\cos(\theta_t+\theta_r)*Q_0. \quad (5b)$$

Because the transmitter 200 and receiver 100 are not ideal, the effect of gain and/or phase imbalance in either the transmitter 200 or receiver 100 of the transceiver 300 will adversely affect the reliability/noise-insensitivity achievable by a true quadrature modulated/demodulated system. If, on the other hand, these gain and phase imbalances $g_t$, $g_r$, $\theta_t$, $\theta_r$ are known or determinable, compensation techniques can be employed to eliminate or cancel the effects of these imbalances, using compensation techniques that are common in the art.

In accordance with this invention, each of the transmitter 200 and receiver 100 of FIG. 1 includes a configuration switch, 320, 310 respectively, that facilitates determination of the aforementioned gain and phase imbalances $g_t$, $g_r$, $\theta_t$, and $\theta_r$.

As noted above, the illustrated configuration of the switches 310, 320 is a 'normal' or default configuration. By altering the state of switch 320, the processing of the $I_0$ and $Q_0$ signals at the transmitter 200 is altered relative to the processing of these signals in the default state. In the altered state, hereinafter defined as the "switched transmitter" state, the "0" degree phase output from the quadrature generators 280 is coupled to the "Q" transmit channel, and the "90" degree phase output from the generator 280 is coupled to the "I" transmit channel, opposite to their connection in the 'normal' state.

Because the phase imbalance is primarily associated with quadrature generator 280 and mixers 250, while the gain imbalance is primarily associated with the amplifiers 240, the previously defined phase imbalance in this state is switched between the I and Q channels, while the gain imbalance remains defined relative to the Q channel as previously defined. Thus, relative to equations 2a and 2b, the output of each channel of the transmitter is expressed as:

$$I_t=\cos\theta_t*I_0, \text{ and} \quad (6a)$$

$$Q_t=\sin\theta_t*I_0-g_t*Q_0, \quad (6b)$$

where $I_t$ and $Q_t$ correspond to the I and Q signal nodes as in the normal, or default configuration, although in this "switched transmitter" state, a receiver will interpret the I transmitted signal to be the Q transmitted signal, and vice versa, as detailed below.

When this signal is transmitted to a receiver 100, the output of the receiver is expressed as:

$$I_r=(Q_t)=\sin\theta_t*I_0-g_t*Q_0 \quad (7a)$$

$$Q_r=g_r*\cos(\theta_r+\theta_t)*I_0+g_r*g_t*\sin\theta_t*Q_0. \quad (7b)$$

By altering the state of switch 310, the processing of the $X_R$ signal at the receiver 100 is altered relative to the processing of these signals in the default state. In the altered state, hereinafter defined as the "switched receiver" state, the "0" degree phase output from the quadrature generators 180 is coupled to the "Q" receive channel, and the "90" degree phase output from the generator 180 is coupled to the "I" receive channel, opposite to their connection in the 'normal' state. In this state, with the transmitter set in the 'normal' mode, the transmit I signal is processed as the Q signal and vice versa. In this state, the previously defined receiver gain imbalance, which is primarily associated with the amplifiers 140, remains defined relative to the Q channel, while the receiver phase imbalance, which is primarily associated with the mixers 120 and generator 180, switches channels. Thus, relative to equations 5a and 5b, the output of each channel of the receiver is expressed as:

$$I_r=\sin\theta_r*I_0+g_t*\cos(\theta_t+\theta_r)*Q_0, \text{ and} \quad (8a)$$

$$Q_r=g_r*I_0+g_r*g_t*\sin\theta_t*Q_0. \quad (8b)$$

Thus, the switches 310, 320 allow the gain imbalance and phase imbalance of each of the receiver 100 and transmitter 200 to be segregated and differentiated. By using appropriate switch combinations to isolate each parameter, test sequences can be developed to determine each of these imbalance parameters $g_t$, $g_r$, $\theta_t$, and $\theta_r$, as detailed further below.

The following test sequence is provided for illustrative purposes. One of ordinary skill in the art will recognize that the ability provided by the switches 310, 320 to isolate the gain and phase imbalances as taught by this invention provides the opportunity to employ various test techniques to measure and/or improve the gain and phase imbalance of quadrature transmitters and receivers.

Applying a test input signal wherein $I_0$ equals a known signal, such as $\cos(\omega_0 t)$, and $Q_0=0$, for example, while the receiver 100 is in the "switched receiver" mode, and the transmitter 200 is in the "normal mode", equation 8b produces:

$$Q_r=g_r*I_0+g_r*g_t*\sin\theta_t*Q_0=g_r*I_0;$$

so that $g_r=Q_r/I_0$. (9)

That is, by applying a known input signal $I_0$ to the $I_0$ input, and a null input signal to the $Q_0$ input of the transmitter 200 while the transmitter 200 is closed-loop coupled to the receiver 100 when the receiver is placed in the "switched receiver" mode, the gain imbalance $g_r$ of the receiver 100 relative to the default mode can be determined by comparing the $Q_r$ output of the receiver 100 to the applied input signal $I_0$. The applied/known input signal $I_0$ can be measured directly at the receiver by placing the transmitter and receiver in the normal mode and applying the known signal to the $I_0$ input, and a null signal to the $Q_0$ input (from equation 5a, $I_r=I_0$).

In like manner, applying the known signal to the $Q_0$ input and a null signal to the $I_0$ input of the transmitter 200 while the transmitter 200 is in the "switched transmitter" mode and the receiver 100 is in the normal mode produces (from equation 7a):

$$I_r = \sin\theta_{t2} * I_0 - g_t * Q_0 = g_t * Q_0;$$

so that $g_t = I_r/Q_0$. (10)

Similarly, applying the known signal to the $Q_0$ input and a null signal to the $I_0$ input while both the receiver and transmitter are in the normal mode produces (from equation 5a):

$$I_r = I_0 - g_r * \sin\Theta_r * Q_0 = -g_r * \sin\Theta_r * Q_0;$$

so that $\Theta_r = \arcsin(-[[I_r]/I_r/(g_t * Q_0))$, (11)

where $g_t$ is found from equation 10.

Finally, applying the known signal to the $I_0$ input and a null signal to the $Q_0$ input while both the receiver and transmitter are in the normal mode produces (from equation 5b):

$$Q_r = g_r * \sin\theta_r * I_0 + g_r * g_t * \cos(\theta_r + \theta_t) * Q_0 = g_r * \sin\theta_r * I_0;$$

so that $\theta_r = \arcsin(Q_r/(g_r * I_0))$, (11)

where $g_r$ is found from equation 9.

Thus, by the application of select test signal combinations to the transmitter 200 and receiver 100 in select configurations, each of the imbalance factors $g_t$, $g_r$, $\theta_t$, and $\theta_r$ can be determined. From these determined values, conventional compensation techniques can be applied to cancel the effect of these imbalances. For example, a variable gain/variable phase shift amplifier can be placed in either the I or Q signal path of each of the receiver and transmitter, and suitably adjusted to provide an inverse of each of the determined parameters. Optionally, an iterative correction process can be employed, wherein some or all of the aforementioned tests are re-applied after the inverse parameters are applied, to verify the resultant I/Q balance and/or to make further corrections.

The foregoing merely illustrates the principles of the invention. It will thus be appreciated that those skilled in the art will be able to devise various arrangements which, although not explicitly described or shown herein, embody the principles of the invention and are thus within the spirit and scope of the following claims.

What is claimed is:

1. A communications device comprising:
at least one pair of channels (I, Q), each channel of the at least one pair of channels (I, Q) including:
a mixer having a data input from an amplifier and a local oscillator input,
at least one quadrature phase generator that is configured to:
provide a first output at a first phase, and
provide a second output at a second phase that is substantially ninety degrees apart from the first phase, wherein a phase imbalance is associated with the mixer and the at least one quadrature phase generator and a gain imbalance is associated with the amplifier,
at least one switch that is configured to:
couple the first output to the local oscillator input of the mixer in a first channel of the at least one pair of channels (I, Q) and the second output to the local oscillator input of the mixer in a second channel of the at least one pair of channels (I, Q), when the switch is in a first mode, and
couple the second output to the local oscillator input of the mixer in the first channel and the first output to the local oscillator input of the mixer in the second channel, when the switch is in a second, and
a controller that isolates the gain imbalance and the phase imbalance by selectively placing the switch into the first mode and the second mode to independently measure the gain imbalance and the phase imbalance for the first channel and the second channel.

2. The communications device of claim 1, further comprising:
a pair of transmitter channels.

3. The communications device of claim 1, further comprising:
a pair of receiver channels.

4. The communications device of claim 1, wherein:
the at least one pair of channels (I, Q) comprises:
a pair of receiver channels,
a pair of transmitter channels,
the at least one quadrature phase generator comprises:
a receiver phase generator, and
a transmitter phase generator,
the at least one switch comprises:
a receiver switch, and
a transmitter switch, and
the controller is further configured to independently control each of the receiver switch and the transmitter switch to facilitate the independent measurement of the gain imbalance and the phase imbalance in each of the receiver channels and transmitter channels.

5. The communications device of claim 4, further comprising:
an adder that is configured to combine outputs of the mixers in the pair of transmitter channels to provide a transmitter output.

6. The communications device of claim 5, wherein the transmitter output is selectively coupled to the mixers in the pair of receiver channels to provide a closed-loop configuration to facilitate testing of the communications device for the gain imbalance and the phase imbalance between the first channel and the second channel of each of the pair of receiver channels and the pair of transmitter channels.

7. The communications device of claim 1, wherein the gain imbalance of a receiver, $g_r$, and the gain imbalance of a transmitter, $g_t$, are functions of known signals applied to channels of the receiver, $I_0$ and $Q_0$, and output signals from channels of the receiver, $I_r$ and $Q_r$, and are respectively defined by these equations:

$$g_r = Q_r/I_0, \text{ and}$$

$$g_t = I_r/Q_0.$$

8. The communications device of claim 7, wherein the phase imbalance of the receiver, $\Theta_r$, and the phase imbalance of the transmitter, $\Theta_t$, are respectively defined by these equations:

$$\Theta_r = \arcsin(Q_r/(g_r * I_0)), \text{ and}$$

$$\Theta_t = \arcsin(-I_r/(g_t * Q_0)).$$

9. A method of testing a gain imbalance and a phase imbalance of at least one pair of communication channels (I, Q), comprising:

configuring a first pair of the at least one pair of communication channels (I, Q) in a first mode that couples a first output of a phase generator to a first channel of the first pair and a second output of the phase generator to a second channel of the first pair, the first output and the second output being separated by approximately ninety degrees;

applying a known signal to the first channel and a null signal to the second channel to obtain a first set of results;

configuring the first pair in a second mode that couples the second output of the phase generator to the first channel and the first output of the phase generator to the second channel;

applying the null signal to the first channel and the known signal to the second channel to obtain a second set of results; and independently measuring the gain imbalance and the phase imbalance of the first channel and second channel of the first pair based on the first set of results and the second set of results.

10. The method of claim 9, further comprising:

configuring a second pair of the at least one pair of communication channels (I, Q) in the first mode to couple a first output of a second phase generator to a first channel of the second pair and a second output of the a second phase generator to a second channel of the second pair;

coupling the second pair to the first pair, so that the first and second sets of results include effects of the second pair;

configuring the second pair in a third mode that couples the second output of the phase generator to the first channel of the second pair and the first output of the phase generator to the second channel of the second pair;

applying the known signal to the first channel of the first pair and the null signal to the second channel of the first pair to obtain a third set of results; and independently measuring the gain imbalance and the phase imbalance of the first channel and second channel of the second pair based on the first set of results and the third set of results.

11. The method of claim 9, wherein the gain imbalance of a receiver, $g_r$, and the gain imbalance of a transmitter, $g_t$, are functions of known signals applied to channels of the receiver, $I_0$ and $Q_0$, and output signals from channels of the receiver, $I_r$ and $Q_r$, and are respectively defined by these equations:

$g_r = Q_r/I_0$, and $g_t = I_r/Q_0$.

12. The method of claim 11, wherein the phase imbalance of the receiver, $\Theta_r$, and the phase imbalance of the transmitter, $\Theta_t$, are respectively defined by these equations:

$\Theta_r = \arcsin(Q_r/(g_r \ast I_0))$, and $\Theta_t = \arcsin(-I_r/(g_t \ast Q_0))$.

13. A method of measuring gain imbalance and phase imbalance in a transceiver that comprises a transmitter and a receiver, each of the transmitter and receiver having a first channel and a second channel, the method comprising:

coupling an output of the transmitter to the receiver;

applying a known signal to the first channel of the transmitter and a null signal to the second channel of the transmitter while the transmitter and the receiver are each in a first mode of operation to obtain a first set of results from the receiver;

setting the transmitter into a second mode of operation;

applying the null signal to the first channel of the transmitter and the known signal to the second channel of the transmitter while the transmitter is in the second mode of operation to obtain a second set of results from the receiver;

setting the receiver into the second mode of operation;

applying the known signal to the first channel of the transmitter and the null signal to the second channel of the transmitter while the receiver is in the second mode of operation to obtain a third set of results from the receiver; and independently measuring the gain imbalance and the phase imbalance based on the first, second, and third set of results;

wherein the first mode of operation includes applying a first phase to the first channel and a second phase to the second channel, the second phase being substantially ninety degrees from the first phase, and the second mode of operation includes applying the second phase to the first channel and the first phase to the second channel.

14. The method of claim 13, further comprising:

determining the gain imbalance of the receiver based on an output of the second channel of the receiver and the known signal applied to the first channel of the transmitter;

determining the gain imbalance of the transmitter based on an output of the first channel of the receiver and the known signal applied to the second channel of the transmitter;

determining the phase imbalance of the transmitter based on the gain imbalance of the transmitter, the output of the first channel of the transmitter, and the known signal applied to the second channel of the transmitter; and determining the phase imbalance of the receiver based on the gain imbalance of the receiver, the output of the second channel of the receiver, and the known signal applied to the first channel of the transmitter.

15. The method of claim 14, further comprising:

determining the known signal based on the output of the first channel of the receiver when applying the known signal to the first channel of the transmitter and the null channel to the second channel of the transmitter.

16. The method of claim 13, wherein the gain imbalance of the receiver, $g_r$, and the gain imbalance of the transmitter, $g_t$, are functions of known signals applied to the channels of the receiver, $I_0$ and $Q_0$, and output signals from the channels of the receiver, $I_r$ and $Q_r$, and are respectively defined by these equations:

$g_r = Q_r/I_0$, and $g_t = I_r/Q_0$.

17. The method of claim 16, wherein the phase imbalance of the receiver, $\Theta_r$, and the phase imbalance of the transmitter, $\Theta_t$, are respectively defined by these equations:

$\Theta_r = \arcsin(Q_r/(g_r \ast I_0))$, and $\Theta_t = \arcsin(-I_r/(g_t \ast Q_0))$.

* * * * *